(12) United States Patent
Wu et al.

(10) Patent No.: US 11,892,778 B2
(45) Date of Patent: Feb. 6, 2024

(54) DEVICE FOR ADJUSTING WAFER, REACTION CHAMBER, AND METHOD FOR ADJUSTING WAFER

(71) Applicant: CHANGXIN MEMORY TECHNOLOGIES, INC., Hefei (CN)

(72) Inventors: Congjun Wu, Hefei (CN); Xing Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 111 days.

(21) Appl. No.: 17/648,727

(22) Filed: Jan. 24, 2022

(65) Prior Publication Data
US 2023/0009207 A1  Jan. 12, 2023

Related U.S. Application Data

(63) Continuation of application No. PCT/CN2021/121033, filed on Sep. 27, 2021.

(30) Foreign Application Priority Data

Jul. 7, 2021  (CN) .......................... 202110767466.4

(51) Int. Cl.
G03F 7/00   (2006.01)
H01L 21/683  (2006.01)
H01L 21/687  (2006.01)

(52) U.S. Cl.
CPC ...... *G03F 7/70775* (2013.01); *H01L 21/6838* (2013.01); *H01L 21/68742* (2013.01)

(58) Field of Classification Search
CPC ............ G03F 7/70775; G03F 7/70733; G03F 7/70875; G03F 7/70991; H01L 21/6838;
(Continued)

(56) References Cited

U.S. PATENT DOCUMENTS 8,472,007 B2 * 6/2013 Endo ................. G03F 7/707
355/75
2002/0067585 A1 * 6/2002 Fujiwara ............. H01L 21/6838
361/234
(Continued)

FOREIGN PATENT DOCUMENTS

CN   107591356 A   1/2018
CN   105810612 B   12/2018
(Continued)

OTHER PUBLICATIONS

International Search Report cited in PCT/CN2021/121033 dated Mar. 2, 2022, 9 pages.

*Primary Examiner* — Deoram Persaud
(74) *Attorney, Agent, or Firm* — Cooper Legal Group, LLC (57) ABSTRACT

Embodiments of the present disclosure provide a device for adjusting a wafer, a reaction chamber, and a method for adjusting a wafer. The device for adjusting a wafer includes: a lifting module, the lifting module including a first carrier surface configured to carry a wafer, and the first carrier surface ascending to a preset highest position or descending to a preset lowest position relative to a reference surface; a carrier module, the carrier module including a second carrier surface, a position of the second carrier surface being higher than the preset lowest position and being lower than the preset highest position, and the second carrier surface being configured to receive and carry the wafer carried on the first carrier surface; and a suction module, the suction module including a first suction opening facing the wafer and surrounded by the second carrier surface.

12 Claims, 4 Drawing Sheets

(58) Field of Classification Search
CPC .............. H01L 21/68742; G06F 1/1605; G06F 16/638; G06F 16/68; G06F 16/9038; G06F 16/907; G06F 3/1454; G06F 3/16; G11B 20/10
See application file for complete search history.

(56) References Cited

U.S. PATENT DOCUMENTS

| | | | |
|---|---|---|---|
| 2007/0128889 A1* | 6/2007 | Goto | H01L 21/67103 414/935 |
| 2007/0152690 A1* | 7/2007 | Sung | G03F 7/707 324/750.16 |
| 2013/0146785 A1* | 6/2013 | Gilissen | H01L 21/68735 250/453.11 |
| 2016/0111318 A1* | 4/2016 | Ichinose | G03F 7/70733 269/21 |
| 2020/0102654 A1* | 4/2020 | Mizunaga | H01L 21/67259 |
| 2020/0312678 A1* | 10/2020 | Morikawa | H01L 21/687 |

FOREIGN PATENT DOCUMENTS

| | | |
|---|---|---|
| CN | 209045524 U | 6/2019 |
| CN | 110620074 A | 12/2019 |
| CN | 209843684 U | 12/2019 |
| CN | 210743929 U | 6/2020 |

\* cited by examiner

DEVICE FOR ADJUSTING WAFER, REACTION CHAMBER, AND METHOD FOR ADJUSTING WAFER

CROSS-REFERENCE TO RELATED APPLICATIONS

This is a continuation of International Application No. PCT/CN2021/121033, filed on Sep. 27, 2021, which claims the priority to Chinese Patent Application No. 202110767466.4, titled "DEVICE FOR ADJUSTING WAFER, REACTION CHAMBER, AND METHOD FOR ADJUSTING WAFER" and filed with the China National Intellectual Property Administration (CNIPA) on Jul. 7, 2021. The entire contents of International Application No. PCT/CN2021/121033 and Chinese Patent Application No. 202110767466.4 are incorporated herein by reference.

TECHNICAL FIELD

The present disclosure includes, but is not limited to, a device for adjusting a wafer, a reaction chamber, and a method for adjusting a wafer.

BACKGROUND

In the prior art, after a process is completed and before a next process is performed on a wafer, the wafer needs to undergo intermediate adjustment to ensure that a state of the wafer can meet a requirement of the next process. Requirements of different processes may be different. Requirements of a same process in different reaction chambers may also be different. The intermediate adjustment includes adjustments to a position, a temperature, and a stress of the wafer.

A longer intermediate adjustment time of the wafer leads to a longer production time of a semiconductor structure and less production output of semiconductor structures. On the premise of ensuring that the state of the wafer meets a process requirement, how to shorten adjustment time has become a focus of current research.

SUMMARY

An overview of the subject matter detailed in the present disclosure is provided below, which is not intended to limit the protection scope of the claims.

Embodiments of the present disclosure provide a device for adjusting a wafer, a reaction chamber, and a method for adjusting a wafer.

An embodiment of the present disclosure provides a device for adjusting a wafer, including: a lifting module, the lifting module comprising a first carrier surface configured to carry a wafer, and the first carrier surface ascending to a preset highest position or descending to a preset lowest position relative to a reference surface; a carrier module, the carrier module comprising a second carrier surface, a position of the second carrier surface being higher than the preset lowest position and being lower than the preset highest position, and the second carrier surface being configured to receive and carry the wafer carried on the first carrier surface; and a suction module, the suction module comprising a first suction opening facing the wafer and surrounded by the second carrier surface, and the suction module being configured to adsorb the wafer through the first suction opening.

An embodiment of the present disclosure further provides a reaction chamber, including: a coating and developing device, configured to coat a photoresist on a wafer carried on a device for adjusting a wafer; and any one of the foregoing devices for adjusting a wafer, configured to adjust the wafer coated with the photoresist.

An embodiment of the present disclosure further provides a method for adjusting a wafer, including: providing any one of the foregoing devices for adjusting a wafer; controlling a first carrier surface of a lifting module to ascend to a preset highest position; providing a wafer and controlling the wafer to be carried on the first carrier surface; controlling the first carrier surface to descend to a preset lowest position, such that a second carrier surface of a carrier module receives and carries the wafer; and starting a suction module, to adsorb the wafer through a first suction opening.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are part rather than all of the embodiments of the present disclosure. Those skilled in the art may derive other accompanying drawings based on these accompanying drawings without creative efforts.

One or more embodiments are exemplified by corresponding accompanying drawings, and these exemplified descriptions do not constitute a limitation on the embodiments. Components with the same reference numerals in the accompanying drawings are denoted as similar components, and the accompanying drawings are not limited by scale unless otherwise specified.

DETAILED DESCRIPTION

After a corresponding process is completed on a wafer in a coating and developing device, the wafer is transferred to a cooling plate (interface block chill plate process station (ICPL)), such that a temperature of the wafer is adjusted in advance by using the ICPL. After the wafer is transferred to the ICPL, based on an occupancy status of a temperature stabilization unit (TSU), the wafer is further transferred. If there is another wafer in the TSU or a failure occurs on the TSU, the wafer is transferred to a wafer stationary buffering stage (SBU), to wait for repairing or empty space of the TSU, wherein the SBU has no temperature adjustment function for the wafer. If there is no other wafer in the TSU and the TSU is in a normal state, the wafer is transferred from the ICPL or the SBU to the TSU.

Figure 1:
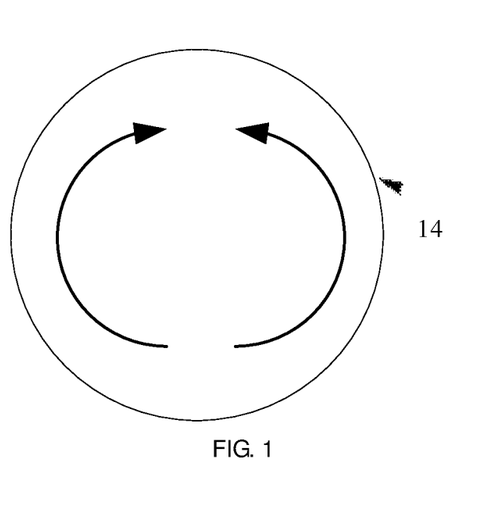
FIG. 1 is a schematic diagram of a double helix phenomenon of a photoresist in the related art.

The TSU and a scanning exposure device are located in a same chamber. The TSU is configured to relieve a stress of the wafer and further adjust a temperature of the wafer, to prepare for exposure of a photoresist of the scanning exposure device. Because the ICPL adjusts the temperature of the wafer in advance, a temperature adjustment time of the TSU is shortened. However, based on existing process parameters of the ICPL and the TSU, after the temperature adjustment and the stress relief, those skilled in the art find that the photoresist exposed through the scanning exposure device represents a double helix phenomenon (refer to FIG. 1). In other words, a photoresist on a wafer 14 receives a stress in a direction of an arrow in FIG. 1, and stress relief of the wafer 14 does not meet a requirement. To suppress the double helix phenomenon, a time of relieving a stress by the TSU can be selected to be extended. However, this selection leads to a longer production time of a semiconductor structure and a lower capacity of production of semiconductor structures.

The embodiments of the present disclosure are described in detail below with reference to the drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 2:
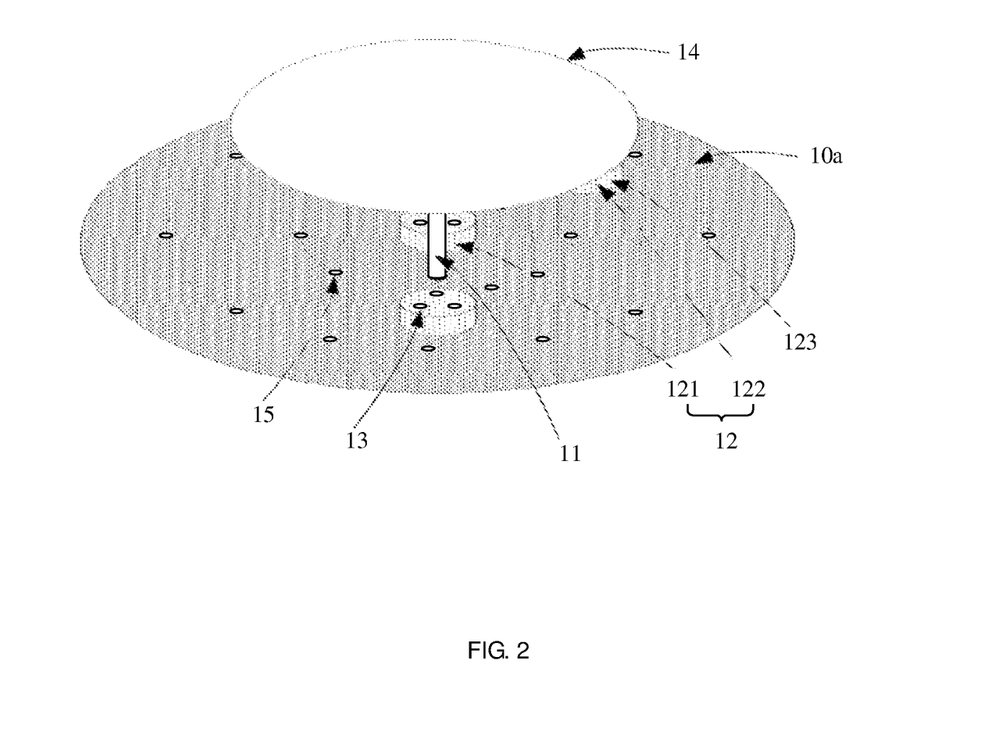
FIG. 2 to FIG. 5 are each a schematic structural diagram of a device for adjusting a wafer according to an embodiment of the present disclosure.
Figure 3:
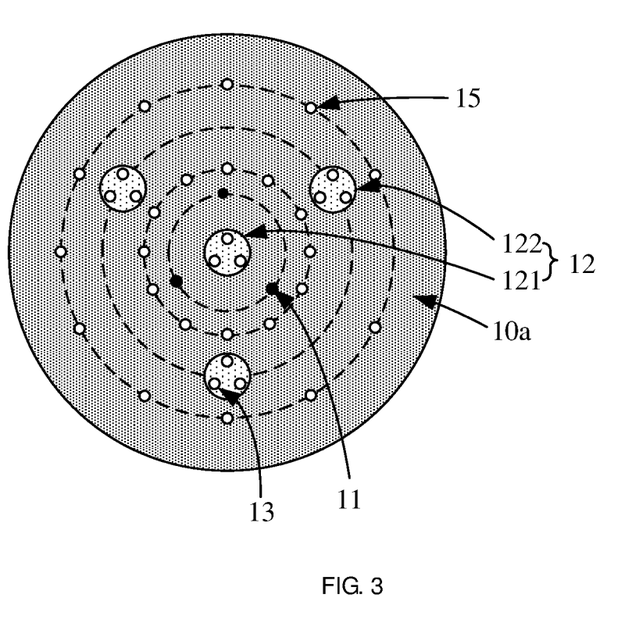
Figure 4:
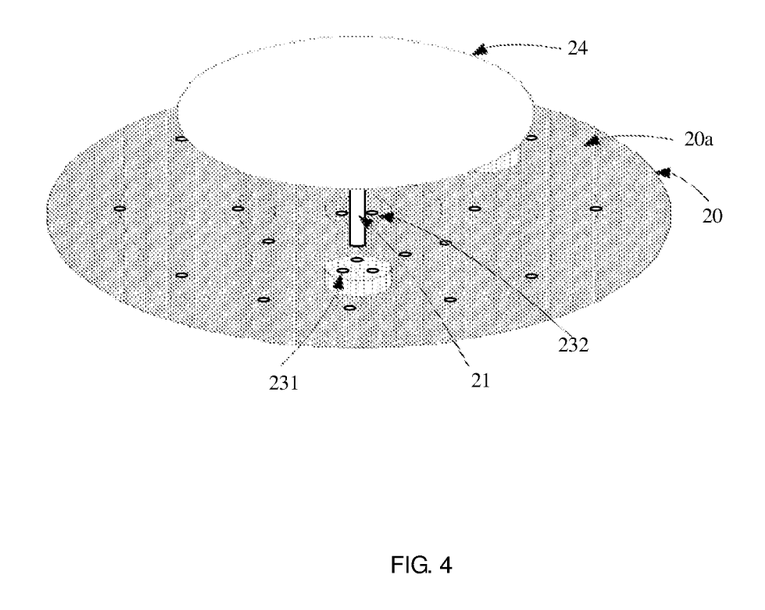
Figure 5:
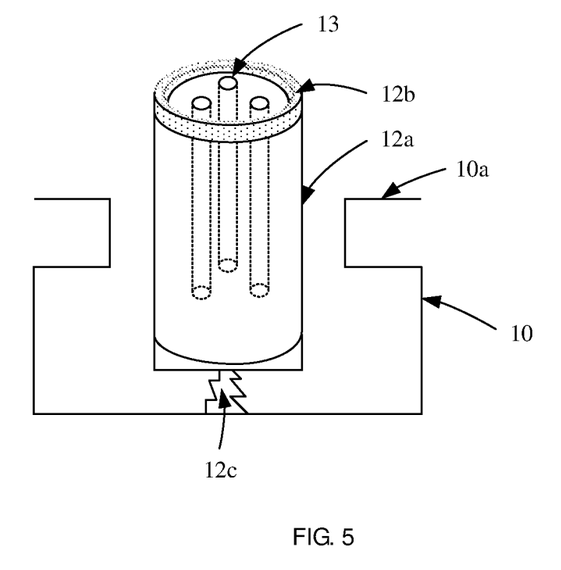

FIG. 2 to FIG. 5 are each a schematic diagram of a device for adjusting a wafer according to an embodiment of the present disclosure. The device for adjusting a wafer may be considered as improvement of the ICPL. FIG. 3 is a schematic planar view of a structure shown in FIG. 2. FIG. 5 is a schematic structural diagram of a carrier unit in the structure shown in FIG. 2.

Referring to FIG. 2 and FIG. 3, the device for adjusting a wafer includes: a lifting module 11, wherein the lifting module 11 comprises a first carrier surface configured to carry a wafer 14, and the first carrier surface can ascend to a preset highest position or descend to a preset lowest position relative to a reference surface 10a; a carrier module 12, wherein the carrier module 12 comprises a second carrier surface, a position of the second carrier surface is higher than the preset lowest position and is lower than the preset highest position, and the second carrier surface is configured to receive and carry the wafer 14 carried on the first carrier surface; and a suction module (not shown in the figure), wherein the suction module comprises a first suction opening 13 surrounded by the second carrier surface and facing the wafer 14, and the suction module is configured to adsorb the wafer 14 through the first suction opening 13.

In this embodiment, the lifting module 11 includes a plurality of carrier rods, and the lifting module 11 is configured to carry the wafer 14 transferred by a mechanical arm. To avoid collision that is between the mechanical arm and a structure in which the reference surface 10a is located and that is due to a position deviation, the mechanical arm is usually provided to have a minimum vertical height relative to the reference surface 10a. The preset highest position can be provided for the lifting module 11 based on the minimum vertical height. The preset highest position is provided to be higher than or flush with the minimum vertical height, to ensure that the mechanical arm can safely transfer the wafer 14 to the first carrier surface; and the preset lowest position may be within the reference surface 10a. When the lifting module 11 descends, the first carrier surface moves from the preset highest position to the preset lowest position. When the first carrier surface is flush with the second carrier surface, the first carrier surface and the second carrier surface carry the wafer 14 together. When the first carrier surface is lower than the second carrier surface, the second carrier surface receives and carries the wafer 14.

Because the lifting module 11 is of a movable structure, compared with the fixed carrier module 12, the wafer 14 has a higher probability of being damaged due to a failure that occurs on the lifting module 11. Therefore, the carrier module 12 having the second carrier surface is provided, to help reduce a damaging rate of the wafer 14. Because the second carrier surface is closer to the reference surface 10a compared with the preset highest position, a functional force originated from the reference surface 10a can more effectively affect the wafer 14 carried on the second carrier surface, thereby achieving a preset objective.

In this embodiment, the suction module adsorbs the wafer 14 through suction. A suction action can not only take away heat on a surface of the wafer 14 to reduce a temperature of the wafer 14, but also apply an adsorption force to balance stress states at different positions of the wafer 14 to avoid occurrence of a stress concentration problem of the wafer 14. If the suction module applies the adsorption force to only a region on the back of the wafer 14, the wafer 14 uses a geometric center of the adsorption region as a stress balance point, and a stress tends to be balanced in a particular region. An area of the region in which the stress tends to be balanced is related to an area of the adsorption region. A larger area of the adsorption region indicates a larger region in which the stress tends to be balanced. If the suction module adsorbs the wafer through a plurality of discrete regions, the wafer 14 comprises a plurality of corresponding stress balance regions. The stress balance region means that a stress at any position in a particular region is less than a preset value and a stress difference between different positions is less than the preset value. A case in which damage such as crack occurs on the wafer 14 due to an excessively large absolute value of a stress or an excessively large relative value of the stress at a particular position does not appear.

Compared with adsorbing the wafer 14 through a single region, adsorbing the wafer 14 through a plurality of discrete regions is beneficial to expanding the stress balance region of the wafer 14 and more quickly achieving the overall stress balance of the wafer 14. In addition, because the second carrier surface surrounds the first suction opening 13, if the suction module adsorbs the wafer 14 through the plurality of discrete regions, the carrier module 12 carries the wafer 14 through a plurality of discrete support surfaces. When a total carrier region is the same, the carrying through the plurality of discrete regions is beneficial to shortening a distance between a carrier point and an edge of the wafer 14, thereby avoiding a case in which the edge of the wafer 14 is subject to a relatively large stress due to a relatively large distance from a support point. In an example, the second carrier surface is provided to surround the first suction opening 13. This is beneficial to suppressing deformation of the wafer 14 caused by the adsorption force, and further suppressing a stress concentration problem caused by the deformation of the wafer 14, such that the wafer 14 has a good stress state.

In this embodiment, the carrier module 12 includes a plurality of discrete carrier units 123, carrier surfaces of the plurality of carrier units 123 constitute the second carrier surface, the suction module comprises a plurality of first suction openings 13, and the carrier surface of each carrier unit 123 surrounds at least one of the first suction opening 13.

In some embodiments, as shown in FIG. 2 and FIG. 3, the carrier module 12 includes a plurality of second carrier units 122, the second carrier unit 122 has a fourth carrier surface, a plurality of fourth carrier surfaces constitute the second carrier surface, and a plurality of centers corresponding to the plurality of fourth carrier surfaces are located at a same circle. For example, the carrier module includes three second carrier units 122, and connection lines between three centers corresponding to the fourth carrier surfaces constitute an equilateral triangle. Since distances between two of the three centers are equal, an overlapping area between adsorption regions corresponding to different first suction openings 13 is relatively small, and overlapping between stress balance regions corresponding to the adsorption regions is relatively small. This is beneficial to maximizing the stress balance region of the wafer 14 and optimizing the stress state of the wafer 14. In addition, since the connection lines between the three centers form the equilateral triangle, the three second carrier units 122 can support the wafer 14 more stably, and the adsorption force applied by the suction module to the wafer 14 has a symmetrical characteristic. This is beneficial to making stress states at different symmetrical positions in the wafer 14 be similar, and the stress balance of the wafer 14 is relatively good.

In some embodiments, as shown in FIG. 2 and FIG. 3, the carrier module 12 further includes a first carrier unit 121, the first carrier unit 121 has a third carrier surface, the third carrier surface and the fourth carrier surfaces constitute the second carrier surface together, a plurality of centers corresponding to a plurality of fourth carrier surfaces are located at a same circle, a center of the third carrier surface coincides with a circle center of the circle, and the third carrier surface and each fourth carrier surface separately surround at least one of the first suction openings 13. After stress balance of a plurality of local regions of the wafer 14 is achieved through the plurality of first suction openings 13 on the plurality of second carrier units 122, the first carrier unit 121 located in the center is provided, to help improve the stress balance between the different local regions, thereby improving the overall stress balance of the wafer 14.

In this embodiment, the suction module is further configured to control a suction rate of the first suction openings 13, such that the wafer carried on the carrier module 12 receives a first pressure of 1 kPa to 30 kPa, for example, 5 kPa, 10 kPa, 15 kPa, or 25 kPa, from the first suction openings 13. It may be known that a larger suction rate of the first suction openings 13 indicates a larger adsorption force applied by the suction module to the wafer 14 and a larger first pressure received by the wafer 14. The first pressure is controlled above 1 kPa, to help avoid a relatively long stress relief time caused by an excessively slow suction speed, thereby ensuring that a temperature adjustment time and a stress adjustment time of the wafer meet a requirement. In an example, the first pressure is controlled below 30 kPa, to help avoid stress deformation of the wafer 14 caused by an excessively large first pressure, thereby ensuring that the wafer 14 has a good stress state and function feature.

In another embodiment, referring to FIG. 4, the device for adjusting a wafer further includes: a base plate 20, wherein a top surface of the base plate 20 is used as a reference surface 20a, the reference surface 20a is lower than or is located at the preset lowest position, the suction module further comprises a second suction opening 232 surrounded by the reference surface 20a and facing the wafer 24, the suction module is further configured to adsorb the wafer 24 through a second suction opening 232, a plurality of centers corresponding to a plurality of first suction openings 231 are located at a same circle, and an orthographic projection of a circle center of the circle on the reference surface 20a coincides with a center of the second suction opening 232.

The suction module is configured to adsorb the wafer 24 through the first suction openings 231 and the second suction opening 232 simultaneously, and the suction module is further configured to control a suction rate of the second suction opening 232, such that an adsorption force applied to the wafer 24 through the second suction opening 232 is less than an adsorption force applied to the wafer 24 through the plurality of first suction openings 231. Because there is no carrier object for support in an adsorption region corresponding to the second suction opening 232, the adsorption force of the second suction opening 232 is provided to be less than the adsorption force of the first suction openings 231, to help avoid stress deformation of the wafer 24 caused by an excessively large adsorption force, thereby ensuring that the wafer 24 has a good stress state, and ensuring that the first suction openings 231 and the second suction opening 232 can relieve a stress of the wafer 24 within a relatively short time.

The suction module is configured to control a second pressure, from the second suction opening 232, received by the wafer 24 carried on the carrier module 12, to be 1 kPa to 2 kPa, for example, 1.3 kPa, 1.5 kPa, and 1.7 kPa.

In this embodiment, referring to FIG. 2, the suction module further has a third suction opening 15 provided on the reference surface 10a, and the suction module may exhaust air or suck air through the third suction opening 15. It may be known that regardless of whether the third suction opening 15 exhausts air or sucks air, the heat on the surface of the wafer 14 can be taken away, thereby achieving a purpose of adjusting the temperature of the wafer 14. In addition, if it is necessary to further adsorb the wafer 14 or accelerate the stress relief of the wafer 14, the third suction opening 15 may suck air to adsorb the wafer 14.

In this embodiment, a suction pipeline comprising the first suction opening 13 is provided in the carrier module 12, the second carrier surface exposes the first suction opening 13, and in a direction perpendicular to the reference surface 10a, an orthographic projection of the first suction opening 13 on a plane where the second carrier surface is located is surrounded by the second carrier surface.

Referring to FIG. 5, the carrier module includes a fixing portion 12b and a support portion 12a. The support portion 12a comprises a columnar structure. The suction pipeline having the first suction opening 13 is provided in the columnar structure. The fixing portion 12b is a ring structure provided on an edge of a top surface of the columnar structure. A top surface of the ring structure is used as a carrier surface of the carrier module. A material of the ring structure is an elastic material, for example, a rubber material.

A material with relatively high hardness is usually selected for the support portion 12a to maintain stability. The fixing portion 12b is provided above the support portion 12a to help isolate the wafer from the support portion 12a and avoid friction damage between the support portion 12a and the wafer. In addition, the fixing portion 12b is provided on an edge of the top. Compared with a case in which a plane in which the first suction opening 13 is located is provided as the second carrier surface, this is beneficial to expanding an area of an adsorption region corresponding to the first suction opening 13 and shortening a time required for the stress relief and temperature control. Moreover, the fixing portion 12b is made of the elastic material, which is beneficial to avoiding damage to the wafer caused by the fixing portion 12b under an action of the adsorption force. Preferably, the material of the fixing portion 12b is provided as the rubber material, which is beneficial to increasing a coefficient of friction between the fixing portion 12b and the wafer and preventing the wafer from shifting. This ensures that the adsorption force of the first suction opening 13 can be evenly applied to the wafer, and ensures that the stress of the wafer is evenly relieved.

The carrier module further includes a buffering portion 12c, and the buffering portion 12c is configured to buffer an instantaneous stress that occurs when the carrier module receives and carries the wafer. The buffering portion 12c may be of an elastic structure, for example, a spring.

In this embodiment, the first suction opening 13 includes at least two suction sub-openings, the suction module is configured to adsorb the wafer through the at least two suction sub-openings, a geometric center of a combined pattern formed by all suction sub-openings is used as a center of the first suction opening 13, and a sum of adsorption forces of all the suction sub-openings is used as the adsorption force of the first suction opening 13. Splitting the first suction opening 13 into a plurality of suction sub-openings is beneficial to improving force evenness of the adsorption region corresponding to the first suction opening 13 and further avoiding stress deformation of the wafer caused by a relatively large adsorption force.

For example, the first suction opening 13 includes three suction sub-openings, connection lines between centers of the three suction sub-openings constitute an equilateral triangle, and a center of the equilateral triangle is used as a center of the first suction opening 13.

In this embodiment, a lifting module that can adjust a vertical position of a wafer and a first suction opening that can be surrounded by a second carrier surface are provided, and the first suction opening adsorbs the wafer through suction and fixes the wafer on a carrier module. An adsorption function of the first suction opening can relieve or even a concentrated stress of the wafer and can reduce a temperature of the wafer. A device for adjusting a wafer can not only adjust a vertical height of the wafer relative to a reference surface, but also improve a stress status of the wafer and adjust the temperature of the wafer. In this way, there is no need to provide a plurality of devices to respectively adjust the position, the stress, or the temperature of the wafer. This is beneficial to shortening an adjustment time of the wafer and improving a capacity of production of scanning exposure devices.

An embodiment of the present disclosure further provides a reaction chamber, including: a coating and developing device, configured to coat a photoresist on a wafer carried on a device for adjusting a wafer; and any one of the foregoing devices for adjusting a wafer, configured to adjust the wafer coated with the photoresist.

In this embodiment, the device for adjusting a wafer adjusts a temperature of the wafer and relieves a stress of the wafer in advance, which is beneficial to shortening or even eliminating a temperature adjustment time and a stress relief time that are required for subsequent entry into a scanning exposure chamber, thereby improving a capacity of production of scanning exposure devices.

An embodiment of the present disclosure further provides a method for adjusting a wafer, including: providing any one of the foregoing devices for adjusting a wafer; controlling the first carrier surface of the lifting module to ascend to the preset highest position; providing the wafer and controlling the wafer to be carried on the first carrier surface; controlling the first carrier surface to descend to the preset lowest position, such that the second carrier surface of the carrier module receives and carries the wafer; and starting the suction module, to adsorb the wafer through the first suction opening.

In this embodiment, before controlling the lifting module to descend, start the suction module. This is beneficial to fixing the wafer on the lifting module through an adsorption force and avoiding shifting of the wafer when the wafer starts to descend and in a descending process.

In this embodiment, the carrier module includes the plurality of carrier units, the carrier surfaces of the plurality of carrier units constitute the second carrier surface of the carrier module, the suction module comprises the plurality of first suction openings, and the carrier surface of each carrier unit surrounds one of the first suction openings; and the starting the suction module includes: controlling the suction rate of the first suction openings, such that the wafer carried on the carrier module receives a total pressure of 1 kPa to 30 kPa, for example, 5 kPa, 10 kPa, 15 kPa, or 25 kPa, from the first suction openings.

In this embodiment, an opening time of the suction module is 5 s to 50 s, for example, 10 s, 20 s, 30 s, or 40 s. The working time of the suction module may be adjusted according to an actual requirement, to effectively shorten an adjustment time of the wafer, and avoid a double helix phenomenon of a photoresist.

In this embodiment, providing the first carrier surface can adjust a relative position of the wafer, and a suction function of the first suction opening can relieve or even a concentrated stress of the wafer and can adjust a temperature of the wafer. In other words, the device for adjusting a wafer can not only adjust a vertical height of the wafer relative to the reference surface, but also improve a stress status of the wafer and reduce the temperature of the wafer simultaneously. In this way, there is no need to provide a plurality of devices to respectively adjust the position, the stress, or the temperature of the wafer. This is beneficial to shortening a wafer adjustment time and increasing a capacity of production of scanning exposure devices.

In the description of the specification, the description with reference to terms such as "an embodiment", "an exemplary embodiment", "some implementations", "a schematic implementation" and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

The terms such as "first" and "second" used in the present disclosure can be used to describe various structures, but these structures are not limited by these terms. Instead, these terms are merely intended to distinguish one element from another.

The same elements in one or more accompanying drawings are denoted by similar reference numerals. For the sake of clarity, various parts in the accompanying drawings are not drawn to scale. In addition, some well-known parts may not be shown. For the sake of brevity, the structure obtained by implementing a plurality of steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the device for adjusting a wafer, the reaction chamber, and the method for adjusting a wafer provided in the embodiments of the present disclosure, a lifting module that can adjust a vertical position of a wafer and a first suction opening that can be surrounded by a second carrier surface are provided, and the first suction opening adsorbs the wafer through suction and fixes the wafer on a carrier module. An adsorption function of the first suction opening can relieve or even a concentrated stress of the wafer and can reduce a temperature of the wafer. In other words, a device for adjusting a wafer can not only adjust a vertical height of the wafer relative to a reference surface, but also improve a stress status of the wafer and adjust the temperature of the wafer. In this way, there is no need to provide a plurality of devices to respectively adjust the position, the stress, or the temperature of the wafer. This is beneficial to shortening an adjustment time of the wafer. In addition, carrier surfaces of a plurality of carrier units constitute a second carrier surface. Compared with a single carrier surface, a plurality of carrier surfaces that are provided are beneficial to ensuring an even force of the wafer, thereby avoiding stress damage to the wafer and accelerating stress relief of the wafer.

The invention claimed is:

1. A device for adjusting a wafer, comprising:
a lifting module, the lifting module comprising a first carrier surface configured to carry a wafer, and the first carrier surface ascending to a preset highest position or descending to a preset lowest position relative to a reference surface;
a carrier module, the carrier module comprising a plurality of carrier units, carrier surfaces of the plurality of carrier units constituting a second carrier surface, a position of the second carrier surface being higher than the preset lowest position and being lower than the preset highest position, and the second carrier surface being configured to receive and carry the wafer carried on the first carrier surface;
a base plate, a top surface of the base plate being used as the reference surface, the reference surface being lower than or being located at the preset lowest position; and
a suction module, the suction module comprising a plurality of first suction openings and a second suction opening, the plurality of first suction openings facing the wafer and each surrounded by the carrier surface of one of the plurality of carrier units, the second suction opening facing the wafer and surrounded by the reference surface, the suction module being configured to adsorb the wafer through the plurality of first suction openings and the second suction opening simultaneously, and the suction module being further configured to control a suction rate of the second suction opening, such that an adsorption force applied to the wafer through the second suction opening is less than an adsorption force applied to the wafer through the plurality of first suction openings;
wherein a plurality of centers corresponding to the plurality of first suction openings are located at a same circle, and a center of the second suction opening coincides with a circle center of the circle.

2. The device for adjusting a wafer according to claim 1, wherein the suction module is further configured to control a suction rate of the plurality of first suction openings, such that the wafer carried on the carrier module receives a first pressure of 1 kPa to 30 kPa from the plurality of first suction openings.

3. The device for adjusting a wafer according to claim 1, wherein the suction module is configured to control a second pressure, from the second suction opening, received by the wafer carried on the carrier module, to be 1 kPa to 2 kPa.

4. The device for adjusting a wafer according to claim 1, wherein a-suction pipelines each comprising one of the plurality of first suction openings are provided in the carrier module, the second carrier surface exposes the plurality of first suction openings, and in a direction perpendicular to the reference surface, an orthographic projection of each of the plurality of first suction openings on a plane where the second carrier surface is located is surrounded by the second carrier surface.

5. The device for adjusting a wafer according to claim 4, wherein the carrier module comprises a fixing portion and a support portion, the support portion comprises a columnar structure, each of the suction pipelines is provided in the columnar structure, the fixing portion is a ring structure provided on an edge of a top surface of the columnar structure, and a material of the ring structure is an elastic material.

6. The device for adjusting a wafer according to claim 1, wherein each of the plurality of first suction openings comprises at least two suction sub-openings, and the suction module is configured to adsorb the wafer through suction sub-openings of the plurality of first suction openings.

7. The device for adjusting a wafer according to claim 6, wherein each of the plurality of first suction openings comprises three suction sub-openings, connection lines between centers of the three suction sub-openings constitute an equilateral triangle, and a center of the equilateral triangle is used as a center of a corresponding first suction opening of the plurality of first suction openings.

8. A reaction chamber, comprising:
a coating and developing device and the device for adjusting a wafer according to claim 1, wherein the coating and developing device is configured to coat a photoresist on the wafer carried on the device for adjusting a wafer, and the device for adjusting a wafer is configured to adjust the wafer coated with the photoresist.

9. A method for adjusting a wafer, comprising:
providing the device for adjusting a wafer according to claim 1;
controlling the first carrier surface of the lifting module to ascend to the preset highest position;

providing the wafer and controlling the wafer to be carried on the first carrier surface;

controlling the first carrier surface to descend to the preset lowest position, such that the second carrier surface of the carrier module receives and carries the wafer; and starting the suction module, to adsorb the wafer through the plurality of first suction openings and the second suction opening.

10. The method for adjusting a wafer according to claim 9, comprising: before controlling the lifting module to descend, starting the suction module.

11. The method for adjusting a wafer according to claim 10, wherein an opening time of the suction module is 5 s to 50 s.

12. The method for adjusting a wafer according to claim 9, wherein the starting the suction module comprises: controlling a suction rate of the plurality of first suction openings, such that the wafer carried on the carrier module receives a total pressure of 1 kPa to 30 kPa from the plurality of first suction openings.

\* \* \* \* \*